(12) United States Patent
Sakamoto et al.

(10) Patent No.: US 9,240,327 B2
(45) Date of Patent: Jan. 19, 2016

(54) RESIST UNDERLAYER FILM-FORMING COMPOSITION FOR EUV LITHOGRAPHY CONTAINING CONDENSATION POLYMER

(75) Inventors: Rikimaru Sakamoto, Toyama (JP); Noriaki Fujitani, Toyama (JP); Takafumi Endo, Toyama (JP); Ryuji Ohnishi, Toyama (JP); Bangching Ho, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/236,719

(22) PCT Filed: Jul. 31, 2012

(86) PCT No.: PCT/JP2012/069477
§ 371 (c)(1),
(2), (4) Date: Feb. 3, 2014

(87) PCT Pub. No.: WO2013/018802
PCT Pub. Date: Feb. 7, 2013

(65) Prior Publication Data
US 2014/0170567 A1   Jun. 19, 2014

(30) Foreign Application Priority Data

Aug. 4, 2011   (JP) .................................. 2011-171226

(51) Int. Cl.
*G03F 7/11* (2006.01)
*H01L 21/308* (2006.01)
(Continued)

(52) U.S. Cl.
CPC ............ *H01L 21/3081* (2013.01); *C08G 73/06* (2013.01); *G03F 7/091* (2013.01); *G03F 7/094* (2013.01); *G03F 7/11* (2013.01); *H01L 21/0274* (2013.01); *H01L 21/3086* (2013.01)

(58) Field of Classification Search
CPC ......... C08G 73/06; G03F 7/091; G03F 7/094; H01L 21/3081; H01L 21/3086
USPC ................ 430/322, 271.1, 330, 331; 528/363
See application file for complete search history.

(56) References Cited

U.S. PATENT DOCUMENTS

2008/0038678 A1   2/2008   Kishioka et al.
2011/0059404 A1   3/2011   Sakamoto et al.
(Continued)

FOREIGN PATENT DOCUMENTS

WO   WO 2005/098542 A1   10/2005
WO   WO 2009/104685 A1   8/2009
WO   WO 2010/122948 A1   10/2010

OTHER PUBLICATIONS

Aug. 28, 2012 International Search Report issued in International Application No. PCT/JP2012/069477.

(Continued)

*Primary Examiner* — Amanda C Walke
(74) *Attorney, Agent, or Firm* — Oliff PLC

(57) ABSTRACT

There is provided a resist underlayer film composition for EUV lithography that is used in a device production process using EUV lithography, reduces adverse effects of EUV, and is effective for obtaining a good resist pattern, and to a method for forming a resist pattern that uses the resist underlayer film composition for EUV lithography. A resist underlayer film-forming composition for EUV lithography, including: a polymer having a repeating unit structure of formula (1):

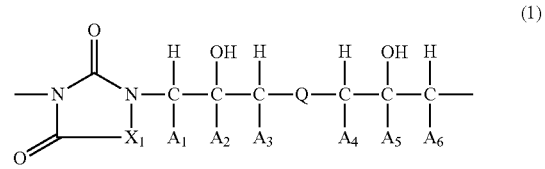

(1)

[where each of $A_1, A_2, A_3, A_4, A_5,$ and $A_6$ is a hydrogen atom, a methyl group, or an ethyl group; $X_1$ is formula (2), formula (3), formula (4), or formula (0):

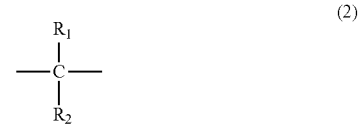

(2)

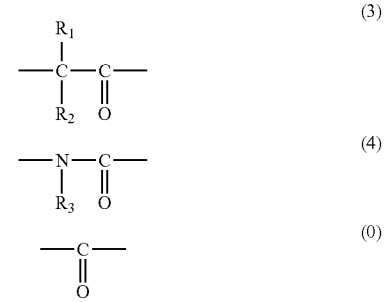

(3)

(4)

(0)

Q is formula (5) or formula (6):

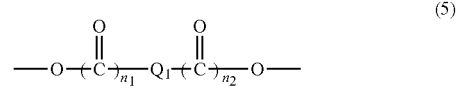

(5)

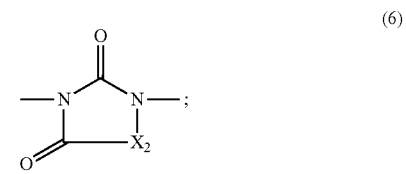

(6)

and a solvent. A resist underlayer film-forming composition for EUV lithography, comprising: the polymer having the repeating unit structure of formula (1); a crosslinkable compound; and a solvent.

8 Claims, No Drawings

(51) Int. Cl.
  *H01L 21/027* (2006.01)
  *C08G 73/06* (2006.01)
  *G03F 7/09* (2006.01)

(56) References Cited

U.S. PATENT DOCUMENTS

2012/0040291 A1   2/2012   Sakamoto et al.
2012/0251955 A1*  10/2012  Sakamoto et al. ............ 430/296
2014/0099791 A1   4/2014   Sakamoto et al.

OTHER PUBLICATIONS

Aug. 28, 2012 Written Opinion issued in International Application No. PCT/JP2012/069477.

* cited by examiner

RESIST UNDERLAYER FILM-FORMING COMPOSITION FOR EUV LITHOGRAPHY CONTAINING CONDENSATION POLYMER

TECHNICAL FIELD

The present invention relates to a resist underlayer film composition for EUV lithography that is used in a device production process using EUV lithography, reduces adverse effects of EUV, and is effective for obtaining a good resist pattern, and to a method for forming a resist pattern that uses the resist underlayer film composition for EUV lithography.

BACKGROUND ART

For manufacturing semiconductor devices, fine processing utilizing a photolithographic technique has been conventionally used. In the fine processing, forming a thin film of a photoresist composition on a substrate to be processed such as a silicon wafer; irradiating the substrate with active light such as ultraviolet through a mask pattern having a pattern of semiconductor device; developing the substrate; and treating the substrate to be processed such as a silicon wafer by etching with an obtained photoresist pattern as a protection film.

In recent years, semiconductor devices tend to be highly integrated, and a wavelength of active light to be used becomes shorter, such that from KrF excimer lasers (248 nm) to ArF excimer lasers (193 nm). Accordingly, the active light produces diffused reflections and standing waves from a substrate. To overcome such disadvantages, an anti-reflective coating (Bottom Anti-Reflective Coating, BARC) has been applied between a photoresist and a substrate to be processed as a resist underlayer film so as to prevent reflection. As the anti-reflective coating, inorganic anti-reflective coatings containing titanium, titanium dioxide, titanium nitride, chromium oxide, carbon, α-silicon, or other compounds; and organic anti-reflective coatings containing light-absorbing substances and macro molecule compounds have been known. For forming films, the former requires vacuum deposition devices, CVD devices, sputtering devices, or the like, the latter requires no special devices. Such an advantage leads to a large number of studies on the organic anti-reflective coating. Examples of the organic anti-reflective coatings include an acrylic resin anti-reflective coating having a hydroxy group that is a cross-linking reaction group, and a light-absorbing group in one molecule; and a novolac resin anti-reflective coating having a hydroxy group that is a cross-linking reaction group, and a light-absorbing group in one molecule.

As physical properties desired for organic anti-reflective coatings are described as follows: large absorbance to light and radiation; no intermixing with photoresist layers (insoluble in resist solvents); no low molecular weight materials being diffused from anti-reflective coating materials to the top coating resist at the time of application, or heating and drying; and a dry etching rate larger than that of a photoresist (see Patent Document 1).

In recent years, an ArF liquid immersion lithography technique in which exposure is conducted through water has been extensively investigated as a next-generation photolithographic technique that follows photolithographic techniques using ArF excimer lasers (193 nm). However, photolithographic techniques utilizing light are facing their limits, and an EUV lithography technique utilizing EUV (having a wavelength of 13.5 nm) has been gathering attention as a novel lithography technique, which follows the ArF liquid immersion lithography technique.

In a device production process utilizing the EUV lithography, defective conditions are caused by adverse effects resulting from ground substrates and/or EUV, for example, a shape of a resist pattern for the EUV lithography becomes a flare or an undercut, and thus a good, straight-shaped resist pattern cannot be obtained; and a sensitivity to EUV is too low to obtain sufficient throughput. Accordingly, in steps of the EUV lithography, although resist underlayer films (anti-reflective coatings) having anti-reflectivity are not needed, resist underlayer films for EUV lithography that can reduce such adverse effects to form a good, straight-shaped resist pattern and to increase a resist sensitivity are needed.

After resist underlayer films for EUV lithography are formed, resists are applied on the films. As in the case of anti-reflective coatings, essential properties of the resist underlayer films are thus as follows: causing no intermixing with resist layers (insoluble in resist solvents); and no low molecular weight materials being diffused from anti-reflective coating materials to the top coating resist at the time of application, or heating and drying.

In the generation in which EUV lithography is used, resist patterns are extremely fine and a thinner resist for EUV lithography are desired. Therefore, the time required for a removing step of organic anti-reflective coating by etching needs to be greatly shortened, and resist underlayer films for EUV lithography available as thin films or resist underlayer films for EUV lithography having a large selection ratio of an etching rate with respect to a resist for EUV lithography.

Examples of the resist underlayer film for EUV lithography include resist underlayer film-forming compositions containing a novolac resin having halogen atom(s), or a resin having acid anhydride(s) (see Patent Documents 2 and 3).

PRIOR ART DOCUMENTS

Patent Documents

Patent Document 1: WO2005-098542
Patent Document 2: WO2010-122948
Patent Document 3: WO2009-104685

SUMMARY OF THE INVENTION

Problem to be Solved by the Invention

The present invention provides a resist underlayer film-forming composition for EUV lithography that is used in an EUV lithography process for manufacturing semiconductor devices. The present invention also provides a resist underlayer film for EUV lithography that allows for reducing adverse effects of ground substrates and EUV, forming a good, straight-shaped resist pattern and increasing a resist sensitivity, causes no intermixing with a resist layer, and has a dry etching rate larger than that of the resist. Moreover, the present invention provides a method for forming a resist pattern for EUV lithography that uses the resist underlayer film-forming composition for EUV lithography.

Means for Solving the Problem

The present invention provides: as a first aspect, a resist underlayer film-forming composition for EUV lithography, comprising:

a polymer having a repeating unit structure of formula (1):

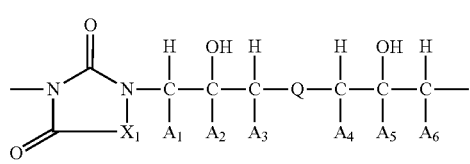
(1)

[where each of $A_1$, $A_2$, $A_3$, $A_4$, $A_5$, and $A_6$ is a hydrogen atom, a methyl group, or an ethyl group; $X_1$ is formula (2), formula (3), formula (4), or formula (0):

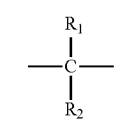
(2)

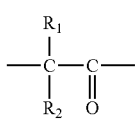
(3)

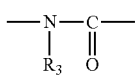
(4)

(0)

(where each of $R_1$ and $R_2$ is a hydrogen atom, a halogen atom, a $C_{1-6}$ alkyl group, a $C_{3-6}$ alkenyl group, a benzyl group, or a phenyl group, where each of the $C_{1-6}$ alkyl group, the $C_{3-6}$ alkenyl group, the benzyl group, and the phenyl group is optionally substituted with a group selected from the group consisting of a $C_{1-6}$ alkyl group, a halogen atom, a $C_{1-6}$ alkoxy group, a nitro group, a cyano group, a hydroxy group, a carboxy group, and a $C_{1-6}$ alkylthio group; $R_1$ and $R_2$ are optionally mutually bonded to form a ring of 3 to 6 carbon atoms; $R_3$ is a halogen atom, a $C_{1-6}$ alkyl group, a $C_{3-6}$ alkenyl group, a benzyl group, or a phenyl group, where the phenyl group is optionally substituted with a group selected from the group consisting of a $C_{1-6}$ alkyl group, a halogen atom, a $C_{1-6}$ alkoxy group, a nitro group, a cyano group, a hydroxy group, and a $C_{1-6}$ alkylthio group); and
Q is formula (5) or formula (6):

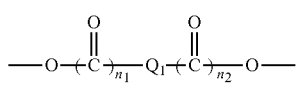
(5)

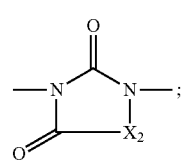
(6)

(where $Q_1$ is a $C_{1-10}$ alkylene group, a phenylene group, a naphthylene group, or an anthrylene group, where each of the alkylene group, the phenylene group, the naphthylene group, and the anthrylene group is optionally substituted with a $C_{1-6}$ alkyl group, a $C_{2-7}$ carbonyloxyalkyl group, a halogen atom, a $C_{1-6}$ alkoxy group, a phenyl group, a nitro group, a cyano group, a hydroxy group, a $C_{1-6}$ alkylthio group, a group having a disulfide group, a carboxy group, or a group of a combination of a $C_{1-6}$ alkyl group, a $C_{2-7}$ carbonyloxyalkyl group, a halogen atom, a $C_{1-6}$ alkoxy group, a phenyl group, a nitro group, a cyano group, a hydroxy group, a $C_{1-6}$ alkylthio group, a group having a disulfide group, and a carboxy group; each of $n_1$ and $n_2$ is the number of 0 or 1; and $X_2$ is formula (2), formula (3), or formula (0); and
   a solvent;
   as a second aspect, a resist underlayer film-forming composition for EUV lithography, comprising: the polymer having the repeating unit structure of formula (1); a crosslinkable compound; and a solvent;
as a third aspect, a resist underlayer film-forming composition for EUV lithography, comprising: the polymer having the repeating unit structure of formula (1); a crosslinkable compound; an acid compound; and a solvent;
as a fourth aspect, the resist underlayer film-forming composition for EUV lithography according to any one of the first aspect to the third aspect, in which the polymer having the repeating unit structure of formula (1) is a polymer produced by a reaction of a compound of formula (7) with a compound of formula (8):

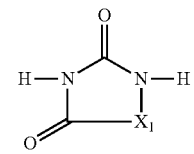
(7)

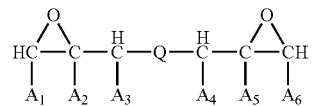
(8)

(in formula (7), $X_1$ is the same as $X_1$ defined in the first aspect; and in formula (8), Q, $A_1$, $A_2$, $A_3$, $A_4$, $A_5$, and $A_6$ are the same as Q, $A_1$, $A_2$, $A_3$, $A_4$, $A_5$, and $A_6$ defined in the first aspect, respectively);
as a fifth aspect, the resist underlayer film-forming composition for EUV lithography according to any one of the first aspect to the third aspect, in which the polymer having the repeating unit structure of formula (1) is a polymer produced by a reaction of a compound of formula (9) with a compound of formula (10):

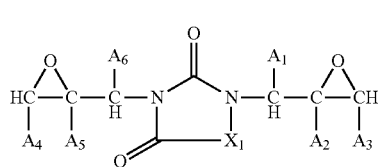
(9)

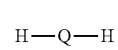
(10)

(in formula (9), $X_1$, $A_1$, $A_2$, $A_3$, $A_4$, $A_5$, and $A_6$ are the same as $X_1$, $A_1$, $A_2$, $A_3$, $A_4$, $A_5$, and $A_6$ defined in the first aspect, respectively; in formula (10), Q is the same as Q defined in the first aspect; and when the compound of formula (10) is a tetracarboxylic acid derivative, the derivative is optionally tetracarboxylic acid dianhydride);

as a sixth aspect, the resist underlayer film-forming composition for EUV lithography according to any one of the first aspect to the fifth aspect, in which a solid content of the resist underlayer film-forming composition for EUV lithography is 0.001 to 1.0% by mass;

as a seventh aspect, the resist underlayer film-forming composition for EUV lithography according to any one of the first aspect to the fifth aspect, in which a solid content of the resist underlayer film-forming composition for EUV lithography is 0.001 to 0.49% by mass;

as an eighth aspect, a resist underlayer film for EUV lithography obtained by applying the resist underlayer film-forming composition for EUV lithography as described in any one of the first aspect to the seventh aspect onto a semiconductor substrate, and baking the resist underlayer film-forming composition thus applied;

as a ninth aspect, the resist underlayer film for EUV lithography according to the eighth aspect, in which a film thickness of the resist underlayer film is 1 nm to 20 nm;

as a tenth aspect, a method for forming an EUV resist pattern used for manufacturing a semiconductor device, the method comprising:

forming a resist underlayer film for EUV lithography by applying the resist underlayer film-forming composition for EUV lithography as described in any one of the first aspect to the seventh aspect onto a semiconductor substrate, and baking the resist underlayer film-forming composition thus applied;

forming an EUV resist layer on the resist underlayer film for EUV lithography;

exposing the semiconductor substrate coated with the resist underlayer film for EUV lithography and the EUV resist layer to light; and developing the EUV resist layer after the exposing; and as an eleventh aspect, the method for forming an EUV resist pattern according to the tenth aspect, in which a film thickness of the resist underlayer film is 1 nm to 20 nm.

Effects of the Invention

A resist underlayer film obtained from the resist underlayer film-forming composition for EUV lithography of the present invention allows for reducing adverse effects of ground substrates and EUV, forming a good, straight-shaped resist pattern and increasing a resist sensitivity. The resist underlayer film has a dry etching rate larger than that of a resist film formed as the upper layer, and in a step of dry etching, a resist pattern can be easily transferred to a ground film to be processed.

Moreover, the under layer film formed with the resist underlayer film-forming composition for EUV lithography of the present invention is excellent in adhesion with a resist film or a ground film.

Resist underlayer films (anti-reflective coatings) used in conventional photolithography processes are provided for preventing reflected light from substrates, whereas the resist underlayer film for EUV lithography of the present invention does not require the effect for preventing reflected light. By forming the resist underlayer film for EUV lithography under a resist film for EUV lithography, a resist sensitivity can be increased at the time of EUV irradiation, and thus a clear resist pattern can be formed.

MODES FOR CARRYING OUT THE INVENTION

The resist underlayer film-forming composition for EUV lithography of the present invention contains a polymer having a repeating unit structure of formula (1) and a solvent. The resist underlayer film-forming composition for EUV lithography of the present invention contains the polymer having the repeating unit structure of formula (1), a crosslinkable compound, and a solvent. The resist underlayer film-forming composition for EUV lithography of the present invention also contains the polymer having the repeating unit structure of formula (1), a crosslinkable compound, an acid compound, and a solvent. Furthermore, the resist underlayer film-forming composition for EUV lithography of the present invention can contain another polymer, a light-absorbing compound, a surfactant, and the like.

The polymer having the repeating unit structure of formula (1) is an essential component of the resist underlayer film-forming composition for EUV lithography of the present invention. In the solid content of the resist underlayer film-forming composition for EUV lithography of the present invention, the percentage of the polymer having the repeating unit structure of formula (1) is 50% by mass or greater, preferably 60% by mass or greater. The percentage of the solid content in the resist underlayer film-forming composition for EUV lithography of the present invention is not particularly limited so long as each component is evenly dissolved in a solvent, and the percentage is, for example, 0.001 to 50% by mass, 0.5 to 50% by mass, 1 to 30% by mass, or 5 to 25% by mass. This resist underlayer film for EUV lithography exhibits a good resist shape when the resist underlayer film is used in a thin film with a film thickness of, for example, about 1 nm to 20 nm. Therefore, adjusting the film thickness within the above range requires the solid content to be 0.001 to 1.0% by mass, 0.001 to 0.50% by mass, 0.001 to 0.49% by mass, or 0.001 to 0.40% by mass. A polymer of formula (1) can be used to form such a thin film. The solid content herein refers to the content of all components in the resist underlayer film-forming composition for EUV lithography except for solvent components.

The resist underlayer film-forming composition for EUV lithography of the present invention contains the polymer having the repeating unit structure of formula (1). In formula (1), each of $A_1$, $A_2$, $A_3$, $A_4$, $A_5$, and $A_6$ is a hydrogen atom, a methyl group, or an ethyl group. $X_1$ is formula (2), formula (3), formula (4), or formula (0), and Q is formula (5) or formula (6). Preferably, $X_1$ is formula (2), formula (3), or formula (4).

In formula (2) and formula (3), each of $R_1$ and $R_2$ is a hydrogen atom, a $C_{1-6}$ alkyl group, a $C_{3-6}$ alkenyl group, a benzyl group, or a phenyl group. Specific examples of the alkyl group include a methyl group, an ethyl group, a propyl group, an isopropyl group, a n-butyl group, and a cyclohexyl group. Specific examples of the alkenyl group include a 2-propenyl group and a 3-butenyl group. The phenyl group may be substituted with a group selected from the group consisting of a $C_{1-6}$ alkyl group, a halogen atom, a $C_{1-6}$ alkoxy group, a nitro group, a cyano group, a hydroxy group, and a $C_{1-6}$ alkylthio group. $R_1$ and $R_2$ may be mutually bonded to form a ring of 3 to 6 carbon atoms, and examples of the ring include a cyclobutane ring, a cyclopentane ring, and a cyclohexane ring.

In formula (4), $R_3$ is a $C_{1-6}$ alkyl group, a $C_{3-6}$ alkenyl group, a benzyl group, or a phenyl group, where the phenyl group may be substituted with a group selected from the group consisting of a $C_{1-6}$ alkyl group, a halogen atom, a $C_{1-6}$ alkoxy group, a nitro group, a cyano group, a hydroxy group, and a $C_{1-6}$ alkylthio group. Specific examples of the alkyl group and alkenyl group include the same groups as those described above. Examples of the alkoxy group include a methoxy group, an ethoxy group, a propoxy group, and an isopropoxy group.

In formula (5), $Q_1$ is a $C_{1-10}$ alkylene group, a phenylene group, a naphthylene group, or an anthrylene group, where each of the alkylene group, phenylene group, naphthylene group, and anthrylene group may be substituted with a $C_{1-6}$ alkyl group, a $C_{2-7}$ carbonyloxyalkyl group, a halogen atom, a $C_{1-6}$ alkoxy group, a nitro group, a cyano group, a hydroxy group, a $C_{1-6}$ alkylthio group, a group having a disulfide group, or a group of a combination of them. As an alkyl portion of the carbonyloxyalkyl group, the alkyl group described above can be used. When an organic group in which a carbonyloxyalkyl group and an alkoxy group are combined is used as a substituent, an alkyl group becomes an alkylene group. Examples of the alkylene group will be described below, and examples of the alkoxy group are as described above.

Examples of the group having a disulfide group include an —S—S—R group and an —R—S—S—R group. The "R" herein refers to an alkyl group, an alkylene group, an aryl group, or an arylene group that will be explained below.
  Specific examples of the alkylene group include a methylene group, an ethylene group, a propylene group, an isopropylene group, a n-pentylene group, a cyclobutylene group, a cyclopentylene group, a cyclohexylene group, and a 2-methylpropylene group.
  Specific examples of the alkyl group include a methyl group, an ethyl group, a propyl group, an isopropyl group, a n-butyl group, and a cyclohexyl group.
  Specific examples of the aryl group include a phenyl group. Specific examples of the arylene group include a phenylene group, a naphthylene group, and an anthrylene group.
  Each of $n_1$ and $n_2$ is an integer of 0 or 1, and $X_2$ is formula (2), formula (3), or formula (0). Preferably, $X_2$ is formula (2) or formula (3).

$X_1$ in formula (7) is the same as $X_1$ defined in formula (1), and $Q, A_1, A_2, A_3, A_4, A_5$, and $A_6$ in formula (8) are the same as $Q, A_1, A_2, A_3, A_4, A_5$, and $A_6$ defined in formula (1), respectively. $X_1, A_1, A_2, A_3, A_4, A_5$, and $A_6$ in formula (9) are the same as $X_1, A_1, A_2, A_3, A_4, A_5$, and $A_6$ defined in formula (1), respectively, and Q in formula (10) is the same as Q defined in formula (1).

Specific examples of the repeating unit structure of formula (1) include repeating unit structures of formula (13) to formula (32).

(13)

(14)

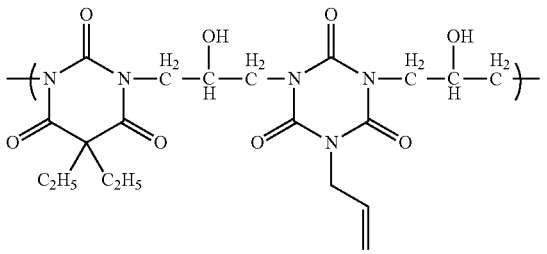

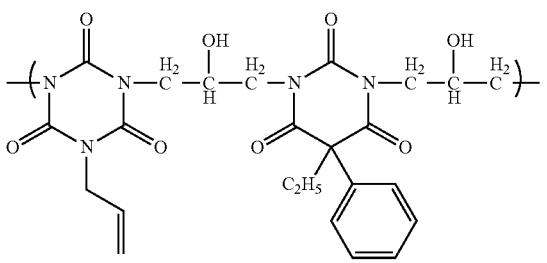

-continued (15)

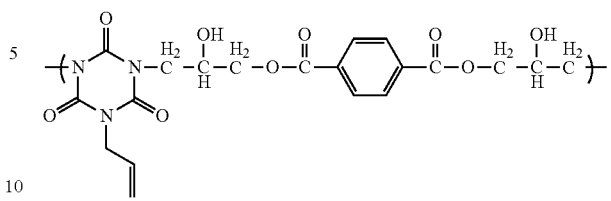

(16)

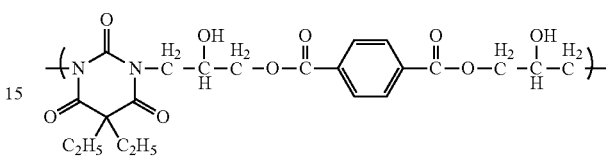

(17)

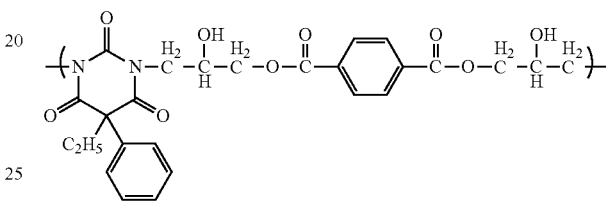

(18)

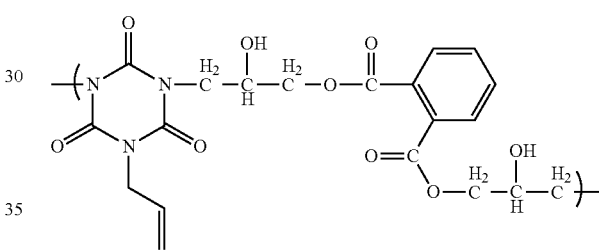

(19)

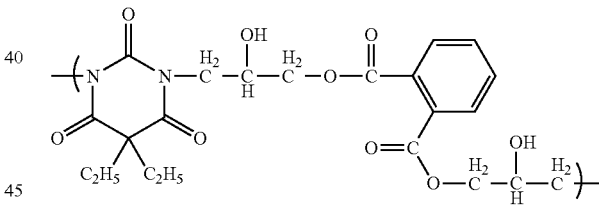

(20)

(21)

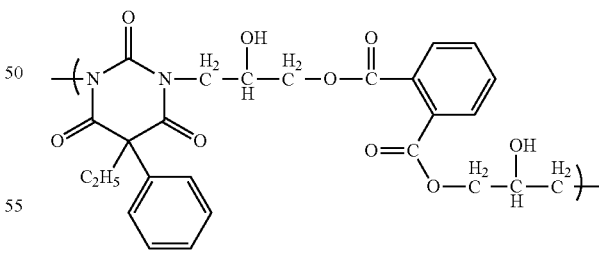

-continued

(22)
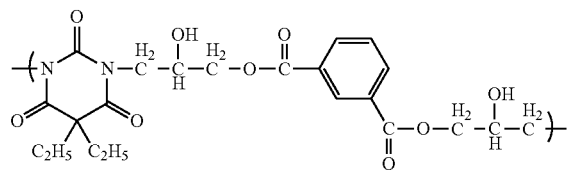

(23)
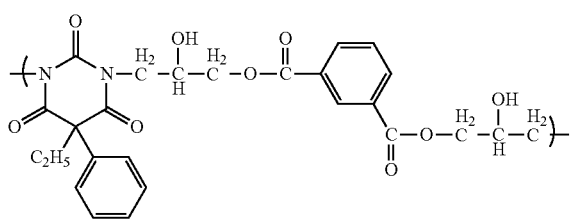

(24)
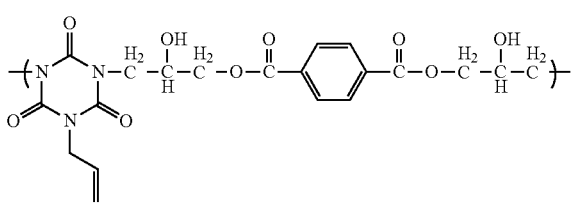

(25)
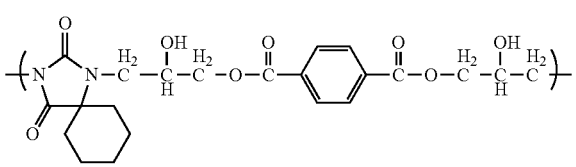

(26)
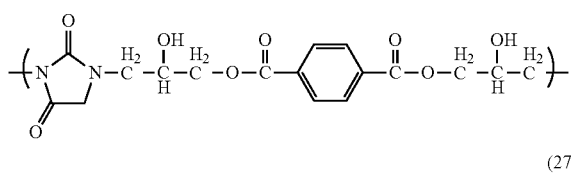

(27)
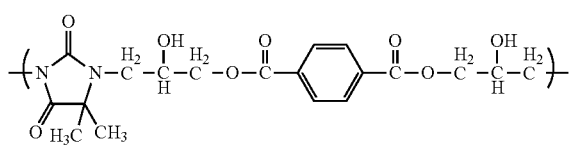

(28)
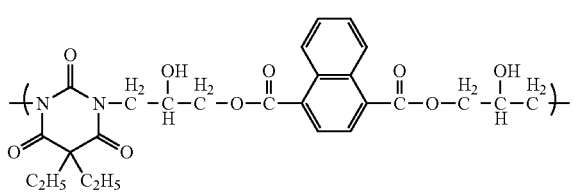

(29)
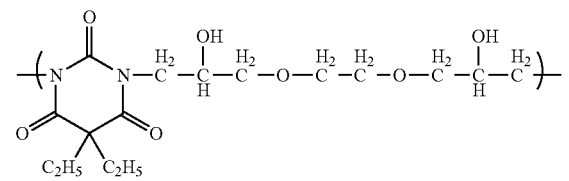

-continued

(30)
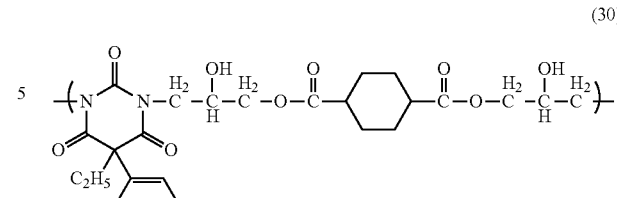

(31)
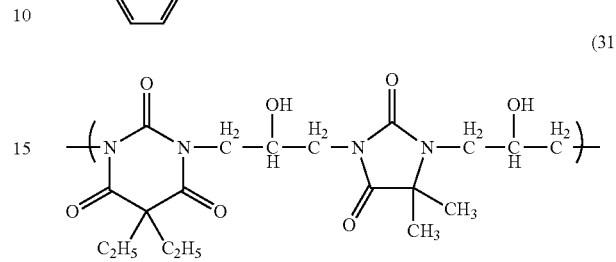

(32)
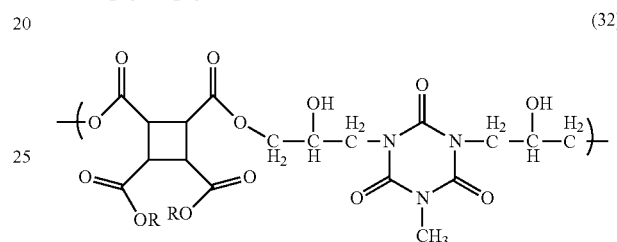

In formula (32), R is an alcohol residue (an organic group of an alcohol excluding a hydroxy group), and the R is an alkyl group, an ether group, or a combination of them. Examples of the R include an alkyl group and an alkoxyalkyl group. Examples of the alkyl group and the alkoxy group are as described above.

The polymer having the repeating unit structure of formula (1), which is contained in the resist underlayer film-forming composition for EUV lithography of the present invention, can be produced by, for example, a reaction of the compound of formula (7) with the compound of formula (8).

The reaction of the compound of formula (7) with the compound of formula (8) is preferably conducted in a solution in which the compounds are dissolved in an organic solvent such as benzene, toluene, xylene, ethyl lactate, butyl lactate, propylene glycol monomethylether, propylene glycol monomethylether acetate, and N-methyl pyrrolidone. In the reaction, a quaternary ammonium salt such as benzyltriethyl ammonium chloride, tetrabutyl ammonium chloride, and tetraethyl ammonium bromide can be used as a catalyst. Although the reaction temperatures and the reaction time for the reaction depend on types of compounds used, concentrations, and the like, the reaction time is suitably selected from a range from 0.1 to 100 hours, and the reaction temperature is suitably selected from a range from 20° C. to 200° C. A catalyst can be used within a range from 0.001 to 30% by mass of the total mass of compounds used.

The molar ratio of the compound of formula (7) and the compound of formula (8) for the reaction is, as the compound of formula (7): the compound of formula (8), 3:1 to 1:3, and preferably 3:2 to 2:3.

In the reaction of the compound of formula (7) with the compound of formula (8), an epoxy ring-opening reaction is caused between two reactive moieties of the compound of formula (7) (N—H sites) and respective epoxy ring sites of different compounds of formula (8). As a result, the polymer having the repeating unit structure of formula (1) is generated. The polymer is considered to be composed by repetition of the repeating unit structures of formula (1).

Specific examples of the compound of formula (7) used for manufacturing the polymer having the repeating unit structure of formula (1) include hydantoin compounds such as hydantoin, 5,5-diphenyl hydantoin, 5,5-dimethyl hydantoin, 5-ethyl hydantoin, 5-benzyl hydantoin, 5-ethyl-5-phenyl hydantoin, 5-methyl hydantoin, 5,5-tetramethylene hydantoin, 5,5-pentamethylene hydantoin, 5-(4-hydroxybenzyl)-hydantoin, 5-phenyl hydantoin, 5-hydroxymethyl hydantoin, and 5-(2-cyanoethyl) hydantoin.

Specific examples of the compound of formula (7) also include barbituric acid compounds such as 5,5-diethyl barbituric acid, 5,5-diallyl barbituric acid, 5-ethyl-5-isoamyl barbituric acid, 5-allyl-5-isobutyl barbituric acid, 5-allyl-5-isopropyl barbituric acid, 5-β-bromoallyl-5-sec-butyl barbituric acid, 5-ethyl-5-(1-methyl-1-butenyl) barbituric acid, 5-isopropyl-5-β-bromoallyl barbituric acid, 5-(1-cyclohexyl)-5-ethyl barbituric acid, 5-ethyl-5-(1-methylbutyl) barbituric acid, 5,5-dibromo barbituric acid, 5-phenyl-5-ethyl barbituric acid, and 5-ethyl-5-n-butyl barbituric acid.

Specific examples of the compound of formula (7) also include isocyanuric acid compounds such as monoallyl isocyanuric acid, monomethyl isocyanuric acid, monopropyl isocyanuric acid, monoisopropyl isocyanuric acid, monophenyl isocyanuric acid, monobenzyl isocyanuric acid, monochloro isocyanuric acid, and monoethyl isocyanuric acid.

Specific examples of the compound of formula (8) used for manufacturing the polymer having the repeating unit structure of formula (1) include diglycidyl compounds such as a terephthalic acid diglycidyl ester, an isophthalic acid diglycidyl ester, a phthalic acid diglycidyl ester, a 2,5-dimethyl terephthalic acid diglycidyl ester, a 2,5-diethyl terephthalic acid diglycidyl ester, a 2,3,5,6-tetrachloro terephthalic acid diglycidyl ester, a 2,3,5,6-tetrabromo terephthalic acid diglycidyl ester, a 2-nitro terephthalic acid diglycidyl ester, a 2,3,5,6-tetrafluoro terephthalic acid diglycidyl ester, a 2,5-dihydroxyterephthalic acid diglycidyl ester, a 2,6-dimethyl terephthalic acid diglycidyl ester, a 2,5-dichloro terephthalic acid diglycidyl ester, a 2,3-dichloro isophthalic acid diglycidyl ester, a 3-nitro isophthalic acid diglycidyl ester, a 2-bromo isophthalic acid diglycidyl ester, a 2-hydroxyisophthalic acid diglycidyl ester, a 3-hydroxyisophthalic acid diglycidyl ester, a 2-methoxy isophthalic acid diglycidyl ester, a 5-phenyl isophthalic acid diglycidyl ester, a 3-nitro phthalic acid diglycidyl ester, a 3,4,5,6-tetrachloro phthalic acid diglycidyl ester, a 4,5-dichloro phthalic acid diglycidyl ester, a 4-hydroxyphthalic acid diglycidyl ester, a 4-nitro phthalic acid diglycidyl ester, a 4-methyl phthalic acid diglycidyl ester, a 3,4,5,6-tetrafluoro phthalic acid diglycidyl ester, a 2,6-naphthalene dicarboxylic acid diglycidyl ester, a 1,2-naphthalene dicarboxylic acid diglycidyl ester, a 1,4-naphthalene dicarboxylic acid diglycidyl ester, a 1,8-naphthalene dicarboxylic acid diglycidyl ester, an anthracene-9,10-dicarboxylic acid diglycidyl ester, and an ethylene glycol diglycidyl ether.

Specific examples of the compound of formula (8) also include diglycidyl hydantoin compounds such as 1,3-diglycidyl hydantoin, 1,3-diglycidyl-5,5-diphenyl hydantoin, 1,3-diglycidyl-5,5-dimethyl hydantoin, 1,3-diglycidyl-5-methyl hydantoin, 1,3-diglycidyl-5-ethyl-5-phenyl hydantoin, 1,3-diglycidyl-5-benzyl hydantoin, 1,3-diglycidyl-5-hydantoin acetic acid, 1,3-diglycidyl-5-ethyl-5-methyl hydantoin, 1,3-diglycidyl-5,5-tetramethylene hydantoin, 1,3-diglycidyl-5,5-pentamethylene hydantoin, 1,3-diglycidyl-5-(4-hydroxybenzyl) hydantoin, 1,3-diglycidyl-5-phenyl hydantoin, 1,3-diglycidyl-5-hydroxymethyl-hydantoin, and 1,3-diglycidyl-5-(2-cyanoethyl) hydantoin.

Specific examples of the compound of formula (8) also include diglycidyl barbituric acid compounds such as 1,3-diglycidyl-5,5-diethyl barbituric acid, 1,3-diglycidyl-5-phenyl-5-ethyl barbituric acid, 1,3-diglycidyl-5-ethyl-5-isoamyl barbituric acid, 1,3-diglycidyl-5-allyl-5-isobutyl barbituric acid, 1,3-diglycidyl-5-allyl-5-isopropyl barbituric acid, 1,3-diglycidyl-5-β-bromo allyl-5-sec-butyl barbituric acid, 1,3-diglycidyl-5-ethyl-5-(1-methyl-1-butenyl) barbituric acid, 1,3-diglycidyl-5-isopropyl-5-β-bromo allyl barbituric acid, 1,3-diglycidyl-5-(1-cyclohexyl)-5-ethyl barbituric acid, 1,3-diglycidyl-5-ethyl-5-(1-methylbutyl) barbituric acid, diglycidyl 1,3-diglycidyl-5,5-diallyl barbiturate, and 1,3-diglycidyl-5-ethyl-5-n-butyl barbituric acid.

For manufacturing the polymer having the repeating unit structure of formula (1), each of the compound of formula (7) and the compound of formula (8) can be used as one type or in combination of two or more types thereof. For example, when monoallyl isocyanuric acid is used as the compound of formula (7), and a terephthalic acid diglycidyl ester is used as the compound of formula (8), a polymer composed of a repeating unit structure of formula (15) is obtained. For example, when 5,5-diethyl barbituric acid is used as the compound of formula (7), and two types of compounds, that is, a terephthalic acid diglycidyl ester and an ethylene glycol diglycidyl ether are used as compounds of formula (8), a polymer composed of a repeating unit structure of formula (16) and a repeating unit structure of formula (29) is obtained.

The polymer having the repeating unit structure of formula (1), which is contained in the resist underlayer film-forming composition for EUV lithography of the present invention, can be produced also by a reaction of a compound of formula (9) with a compound of formula (10).

The reaction of the compound of formula (9) with the compound of formula (10) can be conducted under the same conditions as those for the reaction of the compound of formula (7) with the compound of formula (8).

The molar ratio of the compound of formula (9) and the compound of formula (10) for the reaction is, as formula (9): formula (10), 3:1 to 1:3, and preferably 3:2 to 2:3.

In the reaction of the compound of formula (9) with the compound of formula (10), an epoxy ring-opening reaction is caused between two reactive moieties of the compound of formula (10) (N—H sites or O—H sites) and respective epoxy ring sites of different compounds of formula (9). As a result, the polymer having the repeating unit structure of formula (1) is generated. The polymer is considered to be composed by repetition of repeating unit structures of formula (1).

Specific examples of the compound of formula (9) used for manufacturing the polymer having the repeating unit structure of formula (1) include the diglycidyl hydantoin compounds and the diglycidyl barbituric acid compounds, which are described above as specific examples of formula (8). Furthermore, specific examples of the compound of formula (9) include diglycidyl isocyanuric acid compounds such as monoallyl diglycidyl isocyanuric acid, monoethyl diglycidyl isocyanuric acid, monopropyl diglycidyl isocyanuric acid, monoisopropyl diglycidyl isocyanuric acid, monophenyl diglycidyl isocyanuric acid, monobromo diglycidyl isocyanuric acid, and monomethyl diglycidyl isocyanuric acid.

Specific examples of the compound of formula (10) used for manufacturing the polymer having the repeating unit structure of formula (1) include the hydantoin compounds and the barbituric acid compounds, which are described above as specific examples of formula (7). Furthermore, specific examples of the compound of formula (10) include compounds such as terephthalic acid, isophthalic acid, phthalic acid, 2,5-dimethyl terephthalic acid, 2,5-diethyl terephthalic acid, 2,3,5,6-tetrachloro terephthalic acid, 2,3,5,6-tetrabromo terephthalic acid, 2-nitro terephthalic acid, 2,3,5,6-tetrafluoro terephthalic acid, 2,5-dihydroxyterephthalic acid, 2,6-dimethyl terephthalic acid, 2,5-dichloro terephthalic acid, 2,3-dichloro isophthalic acid, 3-nitro isophthalic acid, 2-bromo isophthalic acid, 2-hydroxyisophthalic acid, 3-hydroxyisophthalic acid, 2-methoxy isophthalic acid, 5-phenyl isophthalic acid, 3-nitro phthalic acid, 3,4,5,6-tetrachloro phthalic acid, 4,5-dichloro phthalic acid, 4-hydroxyphthalic acid, 4-nitro phthalic acid, 4-methyl phthalic acid, 3,4,5,6-tetrafluoro phthalic acid, 2,6-naphthalene dicarboxylic acid, 1,2-naphthalene dicarboxylic acid, 1,4-naphthalene dicarboxylic acid, 1,8-naphthalene dicarboxylic acid, anthracene-9,10-dicarboxylic acid, ethylene glycol, 1,3-propane dicarboxylic acid, 4-hydroxybenzoic acid, and 1,2,3,4-cyclobutane tetra carboxylic acid. When the compound of formula (10) is a tetracarboxylic acid, the compound may be tetracarboxylic acid dianhydride.

For manufacturing the polymer having the repeating unit structure of formula (1), each of the compound of formula (9) and the compound of formula (10) can be used as one type or in combination of two or more types thereof. For example, when monoallyl diglycidyl isocyanuric acid is used as the compound of formula (9), and 5,5-diethyl barbituric acid is used as the compound of formula (10), a polymer composed of a repeating unit structure of formula (13) is obtained.

For example, when monoallyl diglycidyl isocyanuric acid is used as the compound of formula (9), and two types of compounds, that is, terephthalic acid and 5,5-diethyl barbituric acid are used as compounds of formula (10), a polymer composed of the repeating unit structure of formula (13) and a repeating unit structure of formula (24) is obtained.

In the resist underlayer film-forming composition for EUV lithography of the present invention, the polymer having the repeating unit structure of formula (1) can be used as one type or in combination of two or more types thereof.

The weight-average molecular weight of the polymer having the repeating unit structure of formula (1), which is contained in the resist underlayer film-forming composition for EUV lithography of the present invention, is, for example, 1,000 to 200,000, 3,000 to 100,000, or 5,000 to 20,000.

The resist underlayer film-forming composition for EUV lithography of the present invention may contain a crosslinkable compound. Although such a crosslinkable compound is not particularly limited, a crosslinkable compound having at least two cross-linking substituents is preferably used. Examples of the crosslinkable compound include melamine compounds and substituted urea compounds that have cross-linking substituents such as a methylol group and a methoxymethyl group. Specific examples of the melamine compounds and the substituted urea compounds include methoxymethylated glycolurils and methoxymethylated melamines, such as tetramethoxymethyl glycoluril, tetrabutoxymethyl glycoluril, and hexamethoxymethyl melamine. Compounds such as tetramethoxymethyl urea and tetrabutoxymethyl urea are also included. These crosslinkable compounds can induce cross-linking reactions by self-condensation. A cross-linking reaction can also be induced with a hydroxy group in the polymer having the repeating unit structure of formula (1). Anti-reflective coatings formed by such cross-linking reactions become rigid. The anti-reflective coatings also have low solubility in organic solvents. The crosslinkable compound can be used as one type or in combination of two or more types thereof.

The resist underlayer film-forming composition for EUV lithography of the present invention may contain an acid compound. Examples of the acid compound include sulfonic acid compounds such as p-toluenesulfonic acid, trifluoromethanesulfonic acid, and pyridinium-p-toluenesulfonate, and carboxylic acid compounds such as salicylic acid, sulfosalicylic acid, citric acid, benzoic acid, and hydroxybenzoic acid. Examples of the acid compound include acid generators that generate acid under the presence of heat or light, such as 2,4,4,6-tetrabromocyclohexadienone, benzoin tosylate, 2-nitrobenzyl tosylate, p-trifluoromethylbenzenesulfonic acid-2, 4-dinitrobenzyl, phenyl-bis(trichloromethyl)-s-triazine, and N-hydroxysuccinimide trifluoromethanesulfonate. Examples of the acid compound also include iodonium salt acid generators such as diphenyliodonium hexafluorophosphate, diphenyliodonium trifluoromethanesulfonate, and bis(4-tert-butylphenyl)iodonium trifluoromethanesulfonate, and sulfonium salt acid generators such as triphenylsulfonium hexafluoroantimonate and triphenylsulfonium trifluoromethanesulfonate. Sulfonic acid compounds, iodonium salt acid generators, and sulfonium salt acid generators are preferably used as the acid compound. The acid compound can be used as one type or in combination of two or more types thereof.

When the resist underlayer film-forming composition for EUV lithography of the present invention contains the polymer having the repeating unit structure of formula (1) and a crosslinkable compound, the content of the polymer having the repeating unit structure of formula (1) is, for example, 50 to 99% by mass or 60 to 90% by mass of the solid content. The content of the crosslinkable compound is, for example, 1 to 50% by mass or 10 to 40% by mass of the solid content.

When the resist underlayer film-forming composition for EUV lithography of the present invention contains the polymer having the repeating unit structure of formula (1), a crosslinkable compound, and an acid compound, the content of the polymer having the repeating unit structure of formula (1) is, for example, 50 to 99% by mass or 60 to 90% by mass of the solid content. The content of the crosslinkable compound is, for example, 0.5 to 40% by mass or 0.5 to 35% by mass of the solid content. The content of the acid compound is, for example, 0.1 to 10% by mass or 0.1 to 5% by mass of the solid content.

The resist underlayer film-forming composition for EUV lithography of the present invention can also contain optional ingredients such as another polymer, a rheology modifier, and a surfactant, as needed.

Examples of another polymer include polymers that are produced from addition polymerizable compounds. The addition polymerizable polymers are produced from addition polymerizable compounds such as an acrylic acid ester compound, a methacrylic acid ester compound, an acrylamide compound, a methacrylamide compound, a vinyl compound, a styrene compound, a maleimide compound, maleic acid anhydride, and acrylonitrile. Examples of another polymer also include polyesters, polyamides, polyimides, polyamic acids, polycarbonates, polyethers, phenol novolac, cresol novolac, and naphthol novolac. When another polymer is used, the amount thereof is, for example, 0.1 to 40% by mass of the solid content.

Examples of the rheology modifier include phthalic acid compounds such as dimethyl phthalate, diethyl phthalate, diisobutyl phthalate, dihexyl phthalate, and butyl isodecyl phthalate; adipic acid compounds such as di-n-butyl adipate, diisobutyl adipate, diisooctyl adipate, and octyl decyl adipate; maleic acid compounds such as di-n-butyl maleate, diethyl maleate, and dinonyl maleate; oleic acid compounds such as methyl oleate, butyl oleate, and tetrahydrofurfuryl oleate; and stearic acid compounds such as n-butyl stearate and glyceryl stearate. When a rheology modifier is used, the amount thereof is, for example, 0.001 to 10% by mass of the solid content.

Examples of the surfactant include nonionic surfactants including polyoxyethylene alkylethers such as polyoxyethylene lauryl ether, polyoxyethylene stearyl ether, polyoxyethylene cetyl ether, and polyoxyethylene oleyl ether; polyoxyethylene alkylarylethers such as polyoxyethylene octyl phenol ether and polyoxyethylene nonyl phenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including product names Eftop EF301, EF303, and EF352 (manufactured by Tohkem Products Co., Ltd.), product names MEGAFAC F171, F173, R-08, and R-30 (manufactured by Dainippon Ink and Chemicals, Inc.), Fluorad FC430 and FC431 (manufactured by Sumitomo 3M Limited), and product names AsahiGuard AG710, SURFLON S-382, SC101, SC102, SC103, SC104, SC105, and SC106 (manufactured by Asahi Glass Co., Ltd.); and organosiloxane polymer KP341 (manufactured by Shin-Etsu Chemical Co., Ltd.). These surfactants may be used alone or in combination of two or more types thereof. When a surfactant is used, the amount thereof is, for example, 0.0001 to 5% by mass of the solid content.

A solvent used for the resist underlayer film-forming composition for EUV lithography of the present invention is not particularly limited so long as the solid content can be dissolved in the solvent. Examples of the solvent include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methyl propionate, ethoxy ethyl acetate, hydroxy ethyl acetate, methyl 2-hydroxy-3-methyl butanoate, methyl 3-methoxy propionate, ethyl 3-methoxy propionate, ethyl 3-ethoxy propionate, methyl 3-ethoxy propionate, methyl pyruvate, ethyl pyruvate, ethyl acetate, butyl acetate, ethyl lactate, and butyl lactate. These solvents may be used alone or in combination of two or more types thereof. Furthermore, solvents having high boiling points, such as propylene glycol monobutyl ether and propylene glycol monobutyl ether acetate can be blended to use.

In the present invention, both of a negative-type EUV resist and a positive-type EUV resist can be applied as the upper layer of the resist underlayer film for EUV lithography. Examples of the EUV resists include a chemically amplified resist that contains an acid generator and a binder having a group decomposed with acid to change an alkali dissolution rate; a chemically amplified resist that contains an alkali-soluble binder, an acid generator, and a low molecular weight compound decomposed with acid to change an alkali dissolution rate of the resist; a chemically amplified resist that contains an acid generator, a binder having a group decomposed with acid to change an alkali dissolution rate, and a low molecular weight compound decomposed with acid to change an alkali dissolution rate of the resist; a non-chemically amplified resist that contains a binder having a group decomposed with EUV to change an alkali dissolution rate; and a non-chemically amplified resist that contains a binder having a portion cleaved with EUV to change an alkali dissolution rate.

Examples of usable developing solutions for a positive-type resist having a resist underlayer film that is formed by using the resist underlayer film-forming composition for EUV lithography of the present invention include aqueous solutions of alkalis, including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethyl ethanolamine and triethanolamine; quaternary ammonium salts such as tetramethylammonium hydroxide, tetraethylammonium hydroxide, and choline; cyclic amines such as pyrrole and piperidine. Furthermore, suitable amounts of alcohols such as isopropyl alcohol, and surfactants such as nonionic surfactants can also be added to the aqueous solutions of alkalis. Among them, preferable developing solutions are quaternary ammonium salts, and more preferably, tetramethylammonium hydroxide and choline.

In the present invention, a resist underlayer film for EUV lithography is formed by applying a resist underlayer film-forming composition for EUV lithography onto a substrate, and then baking the applied resist underlayer film-forming composition. The temperature for baking is, for example, within a range from 130° C. to 250° C., and preferably 180° C. to 220° C. The film thickness of an obtained resist underlayer film is, for example, within a range from 1 to 30 nm, and preferably 1 to 20 nm.

In the present invention, a semiconductor device is produced by applying a resist underlayer film-forming composition for EUV lithography onto a substrate having a film to be processed to form a transferring pattern; baking the applied resist underlayer film-forming composition to form a resist underlayer film for EUV lithography; coating the top of the resist underlayer film with a resist for EUV lithography; irradiating the substrate, which is coated with the resist underlayer film for EUV lithography and the resist for EUV lithography, with EUV; developing the substrate; and transferring an image onto the substrate with dry etching to form an integrated circuit element.

A semiconductor device to which the resist underlayer film-forming composition for EUV lithography of the present invention is applied, has a structure in which a film to be processed to transfer a pattern; a resist underlayer film; and a resist are formed on a substrate in this order. The resist underlayer film is formed by coating the film to be processed on which the pattern is transferred, with a resist underlayer film-forming composition for EUV lithography containing the polymer having the repeating unit structure of formula (1) and a solvent; and heat-treating the resist underlayer film-forming composition. The resist underlayer film enables adverse effects of ground substrates and EUV to be reduced to form a good, straight-shaped resist pattern and to obtain a margin for a sufficient amount of EUV irradiation. The resist underlayer film has a dry etching rate larger than that of a resist film formed as the upper layer, and in a step of dry etching, a resist pattern can easily be transferred to a ground film to be processed.

EXAMPLES

Synthesis Example 1

100 g of monoallyl diglycidyl isocyanuric acid (manufactured by SHIKOKU CHEMICALS CORPORATION), 66.4 g of 5,5-diethyl barbituric acid, and 4.1 g of benzyltriethyl ammonium chloride were dissolved in 682 g of propylene glycol monomethylether and were caused to react at 130° C. for 24 hours to obtain a solution containing a polymer. The obtained polymer is represented by the formula below, and the GPC analysis showed a weight-average molecular weight of 6,800 in terms of standard polystyrene.

Formula (1-1)

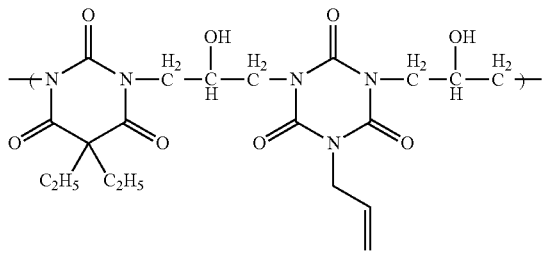

Synthesis Example 2

12.00 g of monomethyl diglycidyl isocyanuric acid (manufactured by SHIKOKU CHEMICALS CORPORATION), 9.32 g of 1,2,3,4-cyclobutane tetra carboxylic acid dianhydride, and 0.54 g of benzyltriethyl ammonium chloride were dissolved in 87.44 g of propylene glycol monomethylether and were caused to react at 130° C. for 24 hours to obtain a solution containing a polymer. The obtained polymer is represented by the formula below, and the GPC analysis showed a weight-average molecular weight of 8,000 in terms of standard polystyrene.

Formula (1-2)

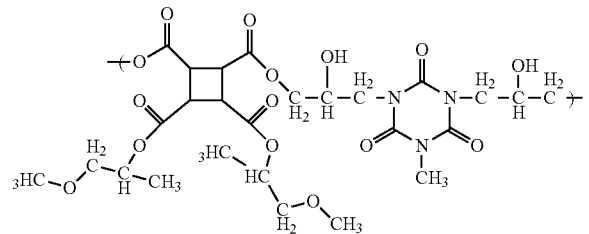

Example 1

10 g of a solution containing 2 g of the polymer obtained in Synthesis Example 1 was mixed with 0.5 g of tetramethoxymethyl glycoluril (manufactured by Nihon Cytec Industries Inc., a product name POWDERLINK [registered trademark] 1174) and 0.05 g of 5-sulfosalicylic acid, and then the mixture was dissolved in 35.4 g of propylene glycol monomethylether and 18.6 g of propylene glycol mono methylether acetate to prepare a solution. The solution was filtered through a polyethylene micro filter having a pore size of 0.10 µm and was further filtered through a polyethylene micro filter having a pore size of 0.05 µm. The filtrate was adjusted to have a solid content of 0.4% by mass with the solvent having the above described proportion to prepare a composition for forming a resist underlayer film (solution).

Example 2

10 g of a solution containing 2 g of the polymer obtained in Synthesis Example 2 was mixed with 0.5 g of tetramethoxymethyl glycoluril (manufactured by Nihon Cytec Industries Inc., a product name POWDERLINK [registered trademark] 1174) and 0.05 g of 5-sulfosalicylic acid, and then the mixture was dissolved in 35.4 g of propylene glycol monomethylether and 18.6 g of propylene glycol mono methylether acetate to prepare a solution. The solution was filtered through a polyethylene micro filter having a pore size of 0.10 µm and was further filtered through a polyethylene micro filter having a pore size of 0.05 µm. The filtrate was adjusted to have a solid content of 0.4% by mass with the solvent having the above described proportion to prepare a composition for forming a resist underlayer film (solution).

[Resist Pattern Formation]

Each of the resist underlayer film-forming compositions produced in Example 1 and Example 2 of the present invention and was applied on a silicon wafer by spin coating, was heated at 205° C. for 1 minute, and a resist underlayer film having a film thickness of 10 nm was formed. A resist solution for EUV (methacrylate resin resist) was applied onto the resist underlayer film by spin coating and was heated to form a resist film having a film thickness of 50 nm. The resist film was exposed to light by using an EUV exposure device (EUV-ADT, manufactured by ASML) under the condition of NA=0.25 and σ=0.5. After the exposure, post exposure bake (PEB) was conducted, and then the resist film was cooled to room temperature on a cooling plate. Development followed by a rinse treatment was conducted to form a resist pattern. The resist pattern was evaluated based on whether a line and space pattern of 30 nm is formed, and the size of line edge roughness (LER) of the pattern that is observed from the top surface of the pattern.

Similarly, as Comparative Example 1, the test was performed for a substrate that had no resist underlayer film formed thereon and was subjected to hexamethyldisilazane (HMDS) treatment.

In the specification of the present invention, the line pattern of line and space pattern was evaluated as "excellent" if the cross section vertical to the substrate was a rectangular shape, "good" if the cross section was a tapered shape (trapezoidal shape) or a flared shape, and "poor" if the line and space pattern was not formed due to collapse of the pattern or defect of resolution.

LER was measured by using critical dimension scanning electron microscopy (CD-SEM), and the two-dimensional pattern edge positions were detected from the top, and a variation of the positions was quantified as LER. Specifically, by using the white band width that was detected by CD-SEM, the line width at 70% of the height from the bottom to the top surface of the pattern was measured at 400 points, and 3σ of the values was determined as an LER value.

When a resist underlayer film having a film thickness of 20 nm or above is used, a resist pattern is damaged when etching is conducted on the underlayer film in the dry etching step following a resist pattern formation because a resist film has a thin film thickness. This causes defects in shape, such as decrease in resist film thickness and a top rounding shape. This makes it difficult to form, a pattern with a desired line width when the substrate is actually processed.

TABLE 1

| | 28 nm<br>Line and Space Formation | LER (nm)<br>Pattern of 28 nm |
|---|---|---|
| Example 1 | Excellent | 4.0 |
| Example 2 | Excellent | 4.3 |
| Comparative Example 1 | Good | 4.5 or above |

INDUSTRIAL APPLICABILITY

The present invention provides a resist underlayer film-forming composition for EUV lithography that is used in an EUV lithography process for manufacturing semiconductor devices. A thin film can be formed from the composition with reduced solid content. An excellent resist pattern can be formed by EUV lithography by the use of the composition.

The invention claimed is:

1. A resist underlayer film for EUV lithography obtained by a method comprising:
applying a resist underlayer film-forming composition for EUV lithography comprising a polymer having a repeating unit structure of formula, (1):

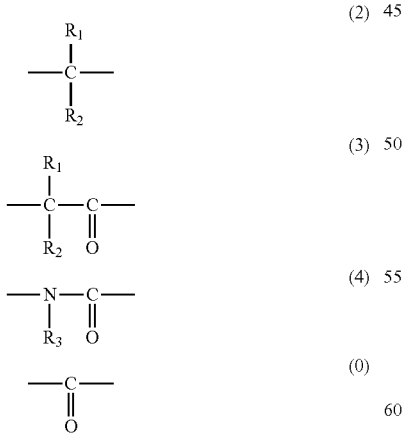

wherein each of $A_1, A_2, A_3, A_4, A_5$, and $A_6$ is a hydrogen atom, a methyl group, or an ethyl group; and
$X_1$ is formula (2), formula (3), formula (4) or formula (0):

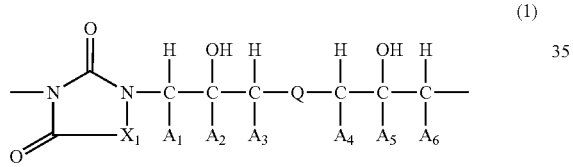

wherein each of $R_1$ and $R_2$ is a hydrogen atom, a halogen atom, a $C_{1-6}$ alkyl group, a $C_{3-6}$ alkenyl group, a benzyl group, or a phenyl group, wherein each of the $C_{1-6}$ alkyl group, the $C_{3-6}$ alkenyl group, the benzyl group, and the phenyl group is optionally substituted with a group selected from the group consisting of a $C_{1-6}$ alkyl group, a halogen atom, a $C_{1-6}$ alkoxy group, a nitro group, a cyano group, a hydroxy group, a carboxy group, and a $C_{1-6}$ alkylthio group;
$R_1$ and $R_2$ are optionally mutually bonded to form a ring of 3 to 6 carbon atoms;
$R_3$ is a halogen atom, a $C_{1-6}$ alkyl group, a $C_{3-6}$ alkenyl group, a benzyl group, or a phenyl group, wherein the phenyl group is optionally substituted with a group selected from the group consisting of a $C_{1-6}$ alkyl group, a halogen atom, a $C_{1-6}$ alkoxy group, a nitro group, a cyano group, a hydroxyl group, and a $C_{1-6}$ alkylithio group; and
Q is formula (5) or formula (6):

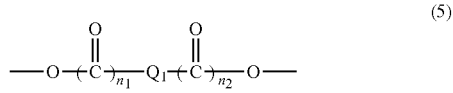

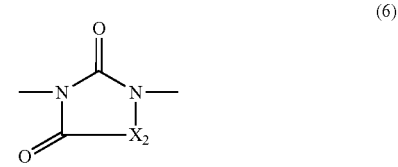

wherein $Q_1$ is a $C_{1-10}$ alkylene group, a phenylene group, a naphthylene group, or an anthrylene group, where each of the alkylene group, the phenylene group, the naphthylene group, and the anthrylene group is optionally substituted with a $C_{1-6}$ alkyl group, a $C_{2-7}$ carbonyloxyalkyl group, a halogen atom, a $C_{1-6}$ alkoxy group, a phenyl group, a nitro group, a cyano group, a hydroxy group, a $C_{1-6}$ alkylthio group, a group having a disulfide group, a carboxy group, or a group of a combination of a $C_{1-6}$ alkyl group, a $C_{2-7}$ carbonyloxyalkyl group, a halogen atom, a $C_{1-6}$ alkoxy group, a phenyl group, a nitro group, a cyano group, a hydroxy group, a $C_{1-6}$ alkylthio group, a group having a disulfide group, and a carboxy group;
each of $n_1$ and $n_2$ is the number of 0 or 1; and
$X_2$ is formula (2), formula (3), or formula (0); and
a solvent
onto a semiconductor substrate, and
baking the applied resist underlayer film-forming composition, wherein
a film thickness of the resist underlayer film is 1 nm to 20 nm.

2. A method for forming an EUV resist pattern used for manufacturing a semiconductor device, the method comprising:
forming a resist underlayer film for EUV lithography by applying a resist underlayer film-forming composition for EUV lithography comprising a polymer having a repeating unit structure of formula (1):

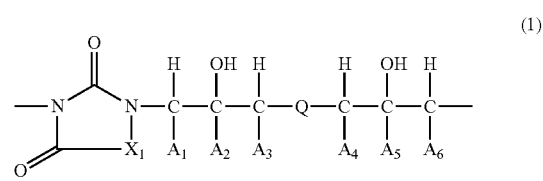

wherein each of $A_1, A_2, A_3, A_4, A_5$, and $A_6$ is a hydrogen atom, a methyl group, or an ethyl group; and $X_1$ is formula (2), formula (3), formula (4) or formula (0):

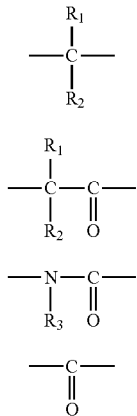

wherein each of $R_1$ and $R_2$ is a hydrogen atom, a halogen atom, a $C_{1-6}$ alkyl group, a $C_{3-6}$ alkenyl group, a benzyl group, or a phenyl group,
  wherein each of the $C_{1-6}$ alkyl group, the $C_{3-6}$ alkenyl group, the benzyl group, and the phenyl group is optionally substituted with a group selected from the group consisting of a $C_{1-6}$ alkyl group, a halogen atom, a $C_{1-6}$ alkoxy group, a nitro group, a cyano group, a hydroxy group, a carboxy group, and a $C_{1-6}$ alkylthio group;
$R_1$ and $R_2$, are optionally mutually bonded to form a ring of 3 to 6 carbon atoms;
$R_3$ is a halogen atom, a $C_{1-6}$ alkyl group, a $C_{3-6}$ alkenyl group, a benzyl group, or a phenyl group,
  wherein the phenyl group is optionally substituted with a group selected from the group consisting of a $C_{1-6}$ alkyl group, a halogen atom, a $C_{1-6}$ alkoxy group, a nitro group, a cyano group, a hydroxy group, and a $C_{1-6}$ alkylthio group; and
Q is formula (5) or formula (6):

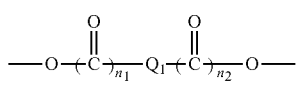

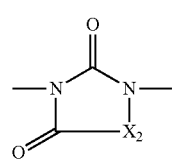

wherein $Q_1$ is a $C_{1-10}$ alkylene group, a phenylene group, a naphthylene group, or an anthrylene group, where each of the alkylene group, the phenylene group, the naphthylene group, and the anthrylene group is optionally substituted with a $C_{1-6}$ alkyl group, a $C_{2-7}$ carbonyloxyalkyl group, a halogen atom, a $C_{1-6}$ alkoxy group, a phenyl group, a nitro group, a cyano group, a hydroxy group a $C_{1-6}$ alkylthio group, a group having a disulfide group, a carboxy group, or a group of a combination of a $C_{1-6}$ alkyl group, a $C_{2-7}$ carbonyloxyalkyl group, a halogen atom, a $C_{1-6}$ alkoxy group, a phenyl group, a nitro group, a cyano group, a hydroxy group, a $C_{1-6}$ alkylthio group, a group having a disulfide group, and a carboxy group;
  each of $n_1$ and $n_2$ is the number of 0 or 1; and
$X_2$ is formula (2), formula (3), or formula (0); and
a solvent onto a semiconductor substrate, and baking the applied resist underlayer film-forming composition;
forming an EUV resist layer on the resist underlayer film for EUV lithography;
exposing the semiconductor substrate coated with the resist underlayer film for EUV lithography and the EUV resist layer to light; and
developing the EUV resist layer after the exposing, wherein
a film thickness of the resist underlayer film is 1 nm to 20 nm.

3. The resist underlayer film for EUV lithography according to claim 1, wherein the resist underlayer film-forming composition further comprises:
a crosslinkable compound.

4. The resist underlayer film for EUV lithography according to claim 1, wherein the resist underlayer film-forming composition further comprises:
a crosslinkable compound; and
an acid compound.

5. The resist underlayer film for EUV lithography according to claim 1, wherein
the polymer having the repeating unit structure of formula (1) is a polymer produced by a reaction of a compound of formula (7) with a compound of formula (8):

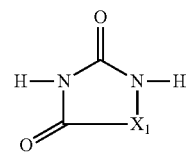

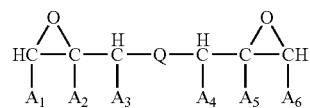

wherein in formula (7), $X_1$ is the same as $X_1$ defined in claim 1; and
in formula (8), Q, $A_1, A_2, A_3, A_4, A_5,$ and $A_6$ are the same as Q, $A_1, A_2, A_3, A_4, A_5,$ and $A_6$ defined in claim 1, respectively.

6. The resist underlayer film for EUV lithography according to claim 1, wherein
the polymer having the repeating unit structure of formula (1) is a polymer produced by a reaction of a compound of formula (9) with a compound of formula (10):

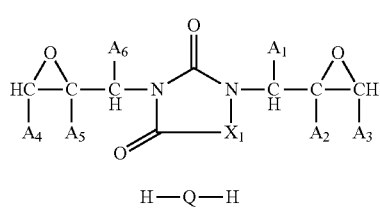

wherein in formula (9), $X_1, A_1, A_2, A_3, A_4, A_5,$ and $A_6$ are the same as $X_1, A_1, A_2, A_3, A_4, A_5,$ and $A_6$ defined in claim 1, respectively;

in formula (10), Q is the same as Q defined in claim 1; and when the compound of formula (10) is a tetracarboxylic acid, the compound is optionally tetracarboxylic acid dianhydride.

7. The resist underlayer film for EUV lithography according to claim 1, wherein a solid content of the resist underlayer film-forming composition for EUV lithography is 0.001 to 1.0% by mass.

8. The resist underlayer film for EUV lithography according to claim 1, wherein a solid content of the resist underlayer film-forming composition for EUV lithography is 0.001 to 0.49% by mass.

* * * * *